(12) United States Patent
Zhang et al.

(10) Patent No.: US 10,735,631 B2
(45) Date of Patent: *Aug. 4, 2020

(54) ELECTRICAL BRACKET AND CIRCUIT CONDUCTING METHOD FOR CAMERA MODULE

(71) Applicant: Ningbo Sunny Opotech Co., Ltd., Ningbo, Zhejiang (CN)

(72) Inventors: Baozhong Zhang, Ningbo (CN); Mingzhu Wang, Ningbo (CN); Nan Guo, Ningbo (CN); Zhen Huang, Ningbo (CN); Feifan Chen, Ningbo (CN)

(73) Assignee: Ningbo Sunny Opotech Co., Ltd., Ningbo, Zhejiang (CN)

( * ) Notice: Subject to any disclaimer, the term of this patent is extended or adjusted under 35 U.S.C. 154(b) by 0 days.

This patent is subject to a terminal disclaimer.

(21) Appl. No.: 16/136,213

(22) Filed: Sep. 19, 2018

(65) Prior Publication Data

US 2019/0058815 A1 Feb. 21, 2019

Related U.S. Application Data

(63) Continuation of application No. 15/057,074, filed on Feb. 29, 2016, now Pat. No. 10,116,843.

(51) Int. Cl.
*H04N 5/225* (2006.01)
*H01L 27/146* (2006.01)

(52) U.S. Cl.
CPC ..... *H04N 5/2252* (2013.01); *H01L 27/14618* (2013.01); *H01L 27/14636* (2013.01); *H04N 5/2253* (2013.01); *H01L 27/14625* (2013.01); *H01L 2224/16225* (2013.01); *H01L 2224/48091* (2013.01); *H01L 2224/73253* (2013.01)

(58) Field of Classification Search
CPC .. H04N 5/2252; H04N 5/2253; H04N 5/2257; H04N 5/2254; H01L 27/14636; H01L 27/14618; H01L 2224/73253; H01L 2224/48091; H01L 2224/16225; H01L 27/14625
See application file for complete search history.

(56) References Cited

U.S. PATENT DOCUMENTS

| | | | |
|---|---|---|---|
| 2004/0240004 A1* | 12/2004 | Ching | H04N 5/2254 358/513 |
| 2010/0328525 A1* | 12/2010 | Lee | H01L 27/14618 348/374 |
| 2013/0128109 A1* | 5/2013 | Ichiki | H01L 27/14618 348/374 |
| 2014/0264693 A1* | 9/2014 | Oganesian | H01L 24/95 257/432 |

* cited by examiner

*Primary Examiner* — Albert H Cutler
(74) *Attorney, Agent, or Firm* — Raymond Y. Chan; David and Raymond Patent Firm

(57) ABSTRACT

A camera module includes an optical lens, a plurality of different camera components, and a plurality of connection elements pre-formed on at least one of the camera components for electrical connection. Each of the connection elements includes a first connection element formed on a surface of the camera component and a first conduction element electrically formed on the first connection element and protruded from the first connection element in order to electrically connect with other camera components.

7 Claims, 14 Drawing Sheets

```
Sa: arraying multiple electrical components of the
            first camera module;
                        │
                        ▼
        S1: arranging a first conduction element on
      electrical components of a first camera module of a
                    camera module; and
                        │
                        ▼
        S2: electrically and securely connecting the first
       conduction element and electrical components of a
       predetermined second camera module with each
                          other.
```

Fig. 9A

Sa: arraying multiple electrical components of the first camera module;

↓

S1: arranging a first conduction element on electrical components of a first camera module of a camera module;

↓

Sb: arranging a first coating layer on the first conduction element; and

↓

S3: electrically and securely connecting the first coating layer and electrical components of a predetermined second camera module with each other.

Fig. 9B

ELECTRICAL BRACKET AND CIRCUIT CONDUCTING METHOD FOR CAMERA MODULE

CROSS REFERENCE OF RELATED APPLICATION

This is a Continuation application claims the benefit of priority under 35 U.S.C. § 120 to a non-provisional application, application Ser. No. 15/057,074, filed Feb. 29, 2016, which non-provisional application that claims priority to Chinese application number CN 201510869216.6, filing date Dec. 1, 2015. The entire contents of each of which are expressly incorporated herein by reference.

NOTICE OF COPYRIGHT

A portion of the disclosure of this patent document contains material which is subject to copyright protection. The copyright owner has no objection to any reproduction by anyone of the patent disclosure, as it appears in the United States Patent and Trademark Office patent files or records, but otherwise reserves all copyright rights whatsoever.

BACKGROUND OF THE PRESENT INVENTION

Field of Invention

The present invention relates to a camera module, and more particularly to an electrical bracket and a circuit conducting method for a camera module.

Description of Related Arts

With the rapid development of electronic products, the electronic products become a vital product in people daily lives. In order to achieve the market demands of space-saving and portability, the electronic products are designed to have a tendency toward lightness and thinness, such that the size of each electronic component must be minimized. Therefore, the size of the camera module must also be minimized with lightness and thinness features correspondingly to be installed into the electronic product.

In order to enhance the camera module pixel accuracy and function, the size of the chip area will be relatively increased to couple with increasing numbers of different drivers, resistors, capacitors and other electronic components. In other words, the packaging size of the camera module will be increased as well. In particular, this is always a conflict between an existing mobile phone module package and the trend of phone camera module with its thinness and miniaturization features, it is necessary to invent a new type of compact packaging technology to meet the demands of product development.

Camera module structure in the traditional COB (chip on board) manufacturing process comprises a printed circuit board, a photosensitive chip, a lens base, a motor driver, and a lens assembly, wherein each of the electronic components of the camera module structure are arranged on a surface of the circuit board, wherein the electronic components are not overlapped with each other. Based on the high requirement of pixel and extra-thin structure of the camera module, the image quality for the camera module is highly expected. Therefore, the packaging and assembling process of the camera module will be complicated and the specification of each electronic component will be relatively high. At the same time, for higher pixel of the camera module, the chip area thereof becomes relatively bigger. The number of electronic components, such as the motor driver, resistors, and capacitors, will be increased. As a result, the overall size of the camera module will be relatively enlarged.

Currently, the design for portable electronic devices, such as smart phones and tablet PCs, has shown a general tendency toward lightness and thinness, which requires various compact sized components of the portable electronic device (especially refers to the thickness of the components) to be more compact by further reducing the sizes thereof. For example, the camera module as a standard component in a portable electronic device has tendency toward lightness and thinness to be installed in the portable electronic device.

Existing mobile phone module package is conflict with the trend of phone camera module with its thinness and miniaturization features, it is necessary to invent a new type of compact packaging technology to meet the demands of product development.

Referring to FIG. 1, a camera module in a prior art is illustrated, wherein the camera module comprises an optical lens 1, a motor 2, an optical filter 3, a base 4, at least one metal wire 5, a drive control member 6, a circuit board 7, a light-sensitive chip 8, at least one motor solder joint 9 and a conductor used for electrically connecting the motor 2 and the circuit board 7. The light-sensitive chip 8 is attached on the top surface of the circuit board 7. The metal wire 5, such as copper wire, is used to connect the light-sensitive chip 8 and the circuit board 7 by wire bonding. The optical filter 3 is attached to the base 3 or the optical lens 1. After the camera module is assembled, the motor pins are soldered in order to electrically connect to the motor 2 and the circuit board 7. So, the circuit board 7 can provide power to the motor 2 and further control the operation of the motor 2.

Although such camera module has been widely used in the market, this camera module still has many drawbacks.

Firstly, the motor 2 has a protruded conductor which is electrically connected to the circuit board 7, so that the motor 2 is electrically connected to the circuit board 7. The conductor is connected to the circuit board 7 through the solder joint 9. The process to connect the motor 2 and the circuit board 7 through a protruded conductor is complicated, and will generate many other problems, such as the product quality might be influenced by the soldering quality. Moreover, this soldering connection by soldering the protruded conductor is not solid, which would be easily damaged during operation or maintenance process.

Furthermore, the circuit board 7 and the light-sensitive chip 8 are connected by the metal wire 5. Such electrical connection is not secured. In addition, the base 4 needs to provide a relative large protection space for the metal wire 5 to be securely set. In other words, the size of the base 4 will be enlarged. Accordingly, the size of the entire camera module will also be enlarged.

Furthermore, the conductor, the metal wire 5 and the drive control module 6 are vulnerable to external environment, such as the dust, etc., so as to affect the quality of the entire camera module and to reduce the service life of the entire camera module.

Furthermore, in order to provide a better supporting function of the base, the size of the base must be enlarged to provide a larger supporting area. Therefore, the overall size of the camera module will become larger as well. If the size of the camera module is reduced by reducing the size of the base, the supporting function of the base will be affected.

Furthermore, the circuit board of the conventional camera module is mounted on a bottom portion of the camera module, wherein the energy consuming components, such as the motor and the photosensitive chip, are arranged in a relatively far distance from the circuit board. In other words, more wires are required to be used in the camera module for electrical connection, and the design of the circuit configuration for the electrical components is more complicated. As a result, the occupying space of the circuit cannot be reasonably utilized. That is to say, if the circuit configuration and the electrical components are reasonably re-designed, the occupying space of the circuit can be effectively minimized. Then, the dimension of the camera module can be further minimized. Of course, the dimension, such as the width or thickness, of the camera module can be selectively adjusted in order to satisfy the market demands.

Accordingly, conventional mobile phone camera module utilizes chip-scale package technology (CSP) or chip-on-board assembly technology (COB), in which each electronic component is placed on the surface of the circuit board, which does not overlap each other between the electronic components. In an autofocus camera module, in order to protect the chip which is placed on the surface of the circuit board, the support is often needed to protect the internal components and to support the motor. With the increasing demand of camera module pixel accuracy and function, the use of different drivers, resistors, capacitors and other electronic components will be correspondingly increased, which will result in the increase of the chip area and the increasing packaging size of the camera module.

As mentioned above, the connection between the circuit board 7 and the light-sensitive chip 8 together with the connection between the motor 2 and the circuit board 7 that both takes certain large space and are difficult to get good protection. At the same time, the base 4 has a large size to be connected with the circuit board 7, the light-sensitive chip 8 and the motor 2. However, it can achieve electrical connection between the circuit board 7 and the motor 2 and between the circuit board 7 and the light-sensitive chip 8. In addition, the base 4 is hardly able to provide enough protection to other electronic components in the camera module.

Accordingly, the photosensitive chip circuit for the conventional camera module is electrical conducted via a chip pad by coating a gold protrusion or gold wire to electrically connect to the circuit board. Therefore, the manufacturing cost and the yield of the camera module are affected by the gold protrusion or the gold wire.

According to the development of the high pixel camera module, the number of the chip pads of the photosensitive chip has become more and more, and clearance spaces between the chips pad will become smaller and smaller, so the manufacturing process of the high pixel camera module will be very difficult and complicated.

In order to achieve a better conduction of the circuit of the camera module, the present invention provides a first connection arrangement and a conduction method for the camera module, wherein different electrical components within the camera module can be electrically connected through the first connection arrangement and the conduction method. For example, the photosensitive chip and the electrical bracket of the camera module can be electrically connected through the first connection arrangement and the conduction method.

SUMMARY OF THE PRESENT INVENTION

The invention is advantageous in that it provides an electrical bracket and a circuit conducting method for a camera module, wherein the camera module has a better performance, and has a strong competitiveness in the market, particularly in the high-end product market.

Another advantage of the invention is to provide an electrical bracket and a circuit conducting method for a camera module, wherein a manufacturing method of the present invention is simple by simplifying the manufacturing steps.

Another advantage of the invention is to provide an electrical bracket and a circuit conducting method for a camera module, wherein the electrical connection method of the present invention also can adjustably control a height of the electrical connection element.

Another advantage of the invention is to provide an electrical bracket and a circuit conducting method for a camera module, wherein only one time of an implanting process is required for adjustably control the height of the electrical connection element.

Another advantage of the invention is to provide an electrical bracket and a circuit conducting method for a camera module, wherein an arraying process can be applied to the present invention to reduce the manufacturing cost and provide an efficient output yield.

Another advantage of the invention is to provide an electrical bracket and a circuit conducting method for a camera module, wherein the camera module comprises a first connection unit, wherein the first connection unit is adapted to electrically and securely connect two camera components of the camera module with each other.

Another advantage of the invention is to provide an electrical bracket and a circuit conducting method for a camera module, wherein a manufacture process of the electrical connection element of the camera module can be processed by a chip manufacturer, a printed circuit board manufacturer, and an electrical bracket manufacturer to simplify the manufacturing steps in the manufacturing process.

Another advantage of the invention is to provide an electrical bracket and a circuit conducting method for a camera module, wherein the camera module comprises a first connection unit, wherein the first connection device has an appropriate height to provide a better electrical connection and supporting function for the camera module.

Another advantage of the invention is to provide an electrical bracket and a circuit conducting method for a camera module, improving a height of the first connection unit not only can reduce the manufacturing cost, but also can simplify the manufacturing process.

Another advantage of the invention is to provide an electrical bracket and a circuit conducting method for a camera module, the first connection unit is arranged to replace the traditional electrical connection terminal which is gold protrusion or gold wire, so that the first connection unit of the present invention provides a better producing yield.

Additional advantages and features of the invention will become apparent from the description which follows, and may be realized by means of the instrumentalities and combinations particular point out in the appended claims.

According to the present invention, the foregoing and other objects and advantages are attained by a camera module comprising:

an optical lens;

a photosensitive chip, wherein light passes through the optical lens to the photosensitive chip; and at least one first connection unit pre-formed on the photosensitive chip for electrical connection.

Accordingly, the first connection unit comprises a first connection element and a first conduction element, wherein the first conduction element is electrically connected on the first connection element.

Accordingly, the first connection unit further comprises a first coating layer, wherein the first coating layer is electrically connected on the first conduction element.

Accordingly, the first connection unit further comprises a first connection element and a first coating layer, wherein the first coating layer is electrically connected on the first connection element.

Accordingly, the first conduction element is embodied as a metal body.

Accordingly, the first coating layer is embodied as a metal coating layer.

Accordingly, the metal coating layer is embodied as a tin coating layer.

Accordingly, the first connection element is embodied as a connection disc.

Accordingly, the connection disc is embodied as a connection pad.

Accordingly, the metal body can, but not limited to, be selectively made of gold, copper, or tin-nickel alloys. Preferably, the metal body is made of gold or copper.

Accordingly, the metal body is a metal cylinder, wherein the metal cylinder is formed on the pad by a plating method.

Accordingly, the metal body is a wafer level cylinder, which is preferably a micro copper pillar.

Accordingly, the metal body is a metal spherical body, wherein the metal spherical body is arranged on the pad by a ball implanting method.

Accordingly, the tin coating layer is plated on the metal body.

Accordingly, the camera module further comprises a motor, wherein the optical lens is operatively coupled at the motor.

Accordingly, the camera module comprises a circuit board, wherein the first connection element is formed on the circuit board, wherein the circuit board and the photosensitive chip is electrically connected by the first connection element.

Accordingly, the circuit board is embodied as a flexible circuit board, wherein the camera module comprises an electrical bracket. The first connection element is formed on the electrical bracket, and the electrical bracket and the photosensitive chip are electrically connected with each other by the first connection element.

Accordingly, two or more first connection units are provided in the present invention, wherein the electrical bracket and the photosensitive chip are electrically connected by one of the first connection units, and the electrical bracket and the motor are electrically connected by another first connection unit. In addition, both of the first connection units are formed on the electrical bracket.

Accordingly, the photosensitive chip and the electrical bracket are electrically connected by the first conduction device of the first connection unit, wherein the first conduction device is securely affixed on the photosensitive chip, wherein the first conduction device of the first connection unit is securely connected with the motor.

Accordingly, the photosensitive chip and the electrical bracket are securely connected with each other by the first coating layer, wherein the first connection unit, which is arranged to connect the motor and the electrical bracket with each other, is securely connected with the motor.

Accordingly, the camera module further comprises an optical filter, wherein the optical filter is aligned at a position between the optical lens and the photosensitive chip.

Accordingly, the camera module further comprises a circuit module, wherein the circuit module comprises a plurality of conductors and electrical components, wherein the conductors are adapted to electrically connect the photosensitive chip, the motor, the circuit board, and the electrical components.

In accordance with another aspect of the invention, the present invention comprises a circuit conducting method, wherein the circuit conducting method comprises steps of:

S1: forming a first conduction element on a first camera component module of the camera module;

S2: electrically and securely connecting the first conduction element and a second camera component module with each other, wherein the first conduction element and the second camera component module are, but not limited to be, soldered with each other;

wherein the electrical components of the first camera module and the second camera module are, but not limited to be, a motor, an electrical bracket, a photosensitive chip, a circuit board, and an electronic component, wherein the first conduction element can be embodied as a metal body.

Accordingly, a first alternative mode of the above mentioned circuit conducting method comprising steps of:

S1: forming a first conduction element on a first camera component module of the camera module;

Sb: forming a first coating layer on the first conduction element, wherein the first coating layer is a metal coating layer, wherein the metal coating layer is, but not limited to, a tin coating layer; and S3: electrically and securely connecting the first coating layer and electrical components of the second camera module with each other;

wherein the electrical components of the first camera module and the second camera module are, but not limited to, a motor, an electrical bracket, a photosensitive chip, a circuit board, and an electronic component, wherein the first conduction element can be embodied as a metal body.

Accordingly, the step S1 can be embodied as that: the metal body is formed on a pad of the electrical component of the first camera module of the camera module.

Accordingly, a second alternative mode of the above mentioned circuit conducting method comprising steps of:

Sc: forming a first coating layer on the electrical component of the first camera module of the camera module, wherein the first coating layer is, but not limited to, a tin coating layer; and S3: electrically and securely connecting the first coating layer and the electrical component of the second camera module with each other by, but not limited to, a soldering method;

wherein the electrical components of the first camera module and the second camera module are, but not limited to, a motor, an electrical bracket, a photosensitive chip, a circuit board, and an electronic component.

Accordingly, the step Sc can be embodied as that: the metal coating layer is attached on a pad of the electrical component of the first camera module of the camera module.

Accordingly, the electrical components of the first camera module and the second camera module are laminated by a wave-soldering technology to achieve the electrical conduction.

Accordingly, a third alternative mode of the above mentioned circuit conducting method comprising steps of:

Sa: providing multiple electrical components of the first camera module.

In accordance with another aspect of the invention, the present invention comprises a camera module which comprising a lens, a photosensitive chip, and a plurality of photosensitive chip connection elements. The optical lens is located along a photosensitive path of the photosensitive chip. The photosensitive chip connection elements are preformed on the photosensitive chip for electrical connection. In particular, the photosensitive chip can be electrically connected to an electrical bracket and/or a circuit board via the photosensitive chip connection elements.

Still further objects and advantages will become apparent from a consideration of the ensuing description and drawings.

These and other objectives, features, and advantages of the present invention will become apparent from the following detailed description, the accompanying drawings, and the appended claims.

BRIEF DESCRIPTION OF THE DRAWINGS

FIGS. 9A to 9C illustrate a circuit conducting method of the camera module according to the above preferred embodiment of the present invention.

DETAILED DESCRIPTION OF THE PREFERRED EMBODIMENT

The following description is disclosed to enable any person skilled in the art to make and use the present invention. Preferred embodiments are provided in the following description only as examples and modifications will be apparent to those skilled in the art. The general principles defined in the following description would be applied to other embodiments, alternatives, modifications, equivalents, and applications without departing from the spirit and scope of the present invention.

Figure 2:
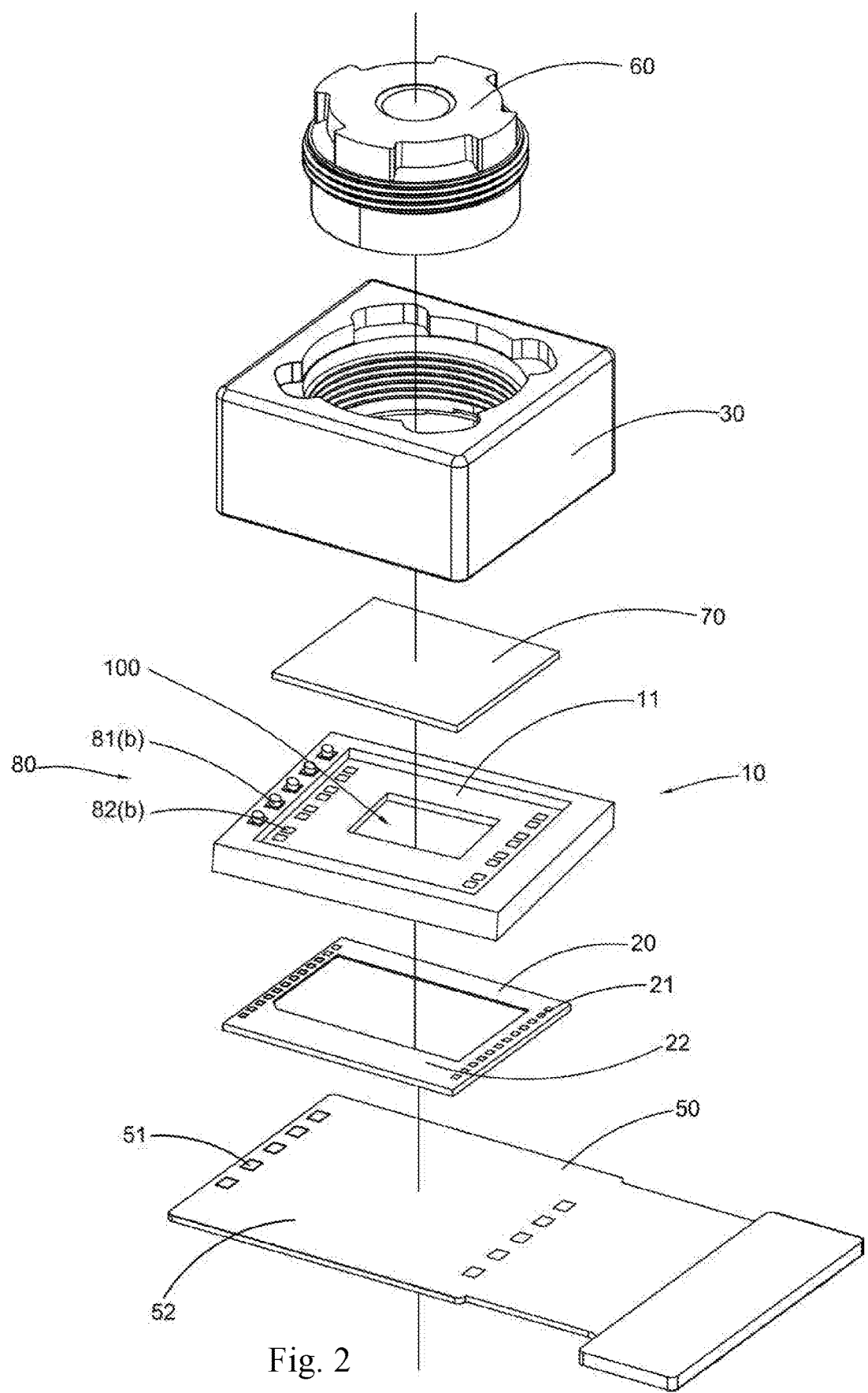
FIG. 2 is an exploded perspective view of a camera module according to a first preferred embodiment of the present invention.
Figure 3:
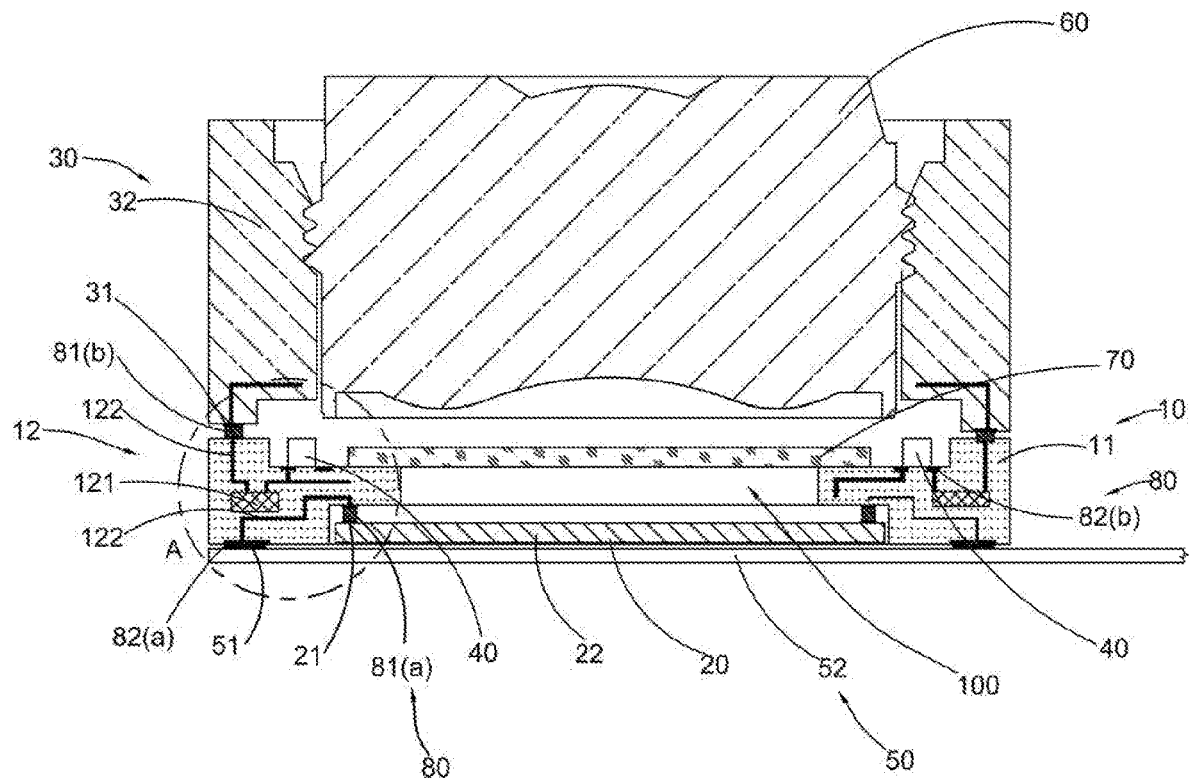
FIG. 3 is a sectional view of the camera module according to the above first preferred embodiment of the present invention.

Referring to FIGS. 2 and 3 of the drawings, a camera module according to a first preferred embodiment of the present invention is illustrated, wherein the camera module comprises an electrical bracket 10, a photosensitive chip 20, a motor 30, a plurality of electrical components 40 (not shown in FIG. 2), a flexible circuit board 50, and an optical lens 60, wherein the motor 30 of the camera module can be supported by the electrical bracket 30.

Generally, the optical lens 60 is operatively coupled at the motor 30, wherein the optical lens 60 can be actuated by the motor 30 to from an auto-focusing mechanism. The flexible circuit board 50 and the motor 30 are arranged on different sides of the electrical bracket 10, and the optical lens 60 is located along a photosensitive path of the photosensitive chip 20. When the camera module is operated for capturing image, the light reflected by the object can be further accepted by the photosensitive chip 20 for photoelectric conversion after passing through the optical lens 60. That is to say, the flexible circuit board 50 and the motor 30 are connected with each other by the electrical bracket 10. In other words, the electrical bracket 10 serves as an integration of a base and a PCB in a conventional camera module, wherein the electrical bracket 10 forms an assembling means for connecting the motor 30 and the optical lens 60 and forms an electrical connection means for electrically connecting to the motor 30, the photosensitive chip 20 and the flexible PCB 50 with each other.

The electrical bracket 10 comprises a main body 11, a circuit module 12, and an optical hole 100. The circuit module 12 is embedded in the main body 11. As shown in FIG. 3, the camera module further comprises a plurality of connection elements 80 electrically connected with the circuit module 12 to electrically connect to the photosensitive chip 20, the motor 30, the electrical components 40, and the flexible circuit board 50 are connected with each other by the connection elements 80, so that the photosensitive chip 20, the motor 30, and the electrical components 40, and the flexible circuit board 50 can be electrically connected.

The circuit module 12 comprises a plurality of electrical elements 121 and a plurality of conductors 122, wherein the conductors 122 are electrically connected to the electrical elements 121 in a default mode. In addition, the conductors 122 are electrically connected to the motor 30, the flexible circuit board 50, and the photosensitive chip 20 through the connection elements 80, so as to pre-form a camera circuit of the camera module for activating and adjusting of the camera module.

As shown in FIG. 2 and FIG. 3, the connection elements 80 are arranged on the main body 11 of the electrical bracket 10, and are electrically connected to the circuit module 12.

According to the above mentioned preferred embodiment, the camera module further comprises an optical filter 70, wherein the optical filter 70 is adapted to filter out stray lights in order to improve the image quality. The optical filter 70 and the electrical components 40 are arranged on the main body 11 of the electrical bracket 10, and the electrical components 40 and the circuit module 12 are electrically connected. It is worth mentioning that the optical filter 70 is not limited to arrange on the main body 11 of the electrical bracket 10.

The photosensitive chip 20 is aligned at a position corresponding to the optical hole 100, so lights can pass through the optical hole 100 and can be received by the photosensitive chip 20.

As shown in FIG. 3, the connection elements 80 comprises two sets of first connection units 81 and multiple sets of second connection units 82, wherein the two sets of the first connection units 81 are connected to the photosensitive chip 20 and the motor 30 respectively, wherein the multiple sets of the second connection units 82 are connected to the electrical components 40 and the flexible circuit board 50 respectively. It is worth mentioning that the first connection units 81 also can be electrically connected to the electrical components 40, the flexible circuit board 50, and/or the optical lens 60.

Figure 4:
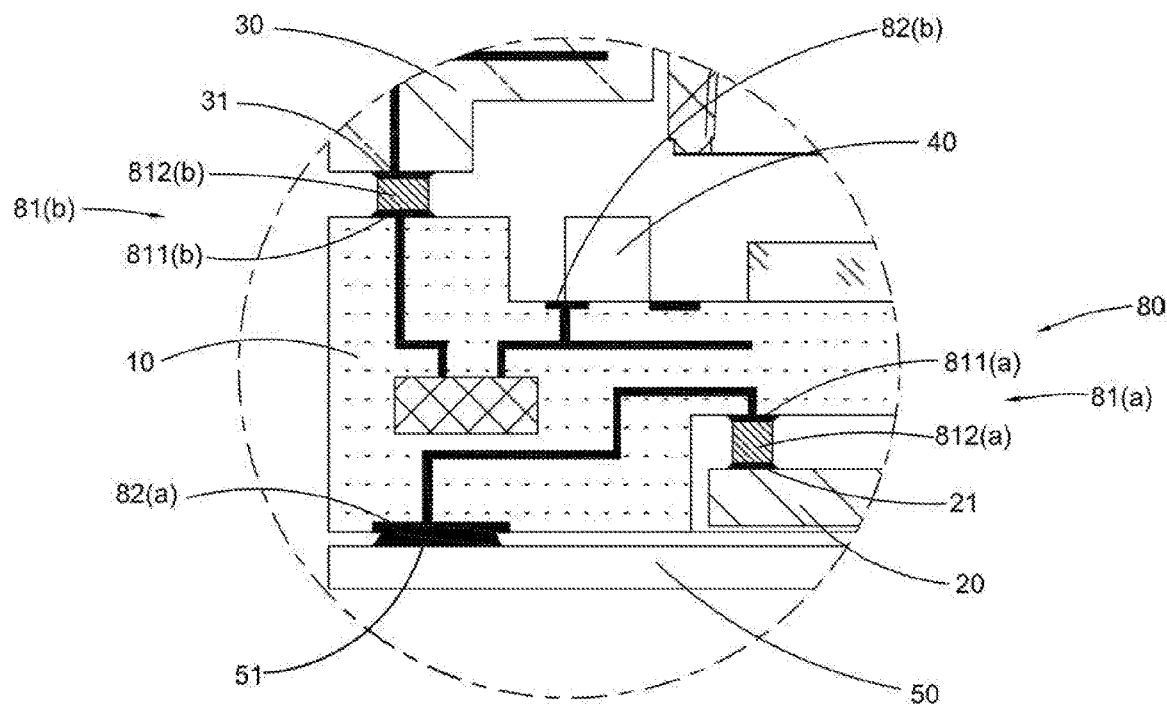
FIG. 4 is an enlarged sectional view of the camera module according to the above mentioned the first preferred embodiment of the present invention, illustrating the electrical connection between different camera components.

As shown in FIG. 4, the first connection unit 81 comprises a first connection element 811 and a first conduction element 812, wherein the first conduction element 812 is arranged on the first connection element 811 to adjustably increase a height of the first connection element 811, so that the first connection element 811 can be electrically connected to the photosensitive chip 20 and the motor 30.

It is worth mentioning that the first connection unit 81 not only electrically connects to the motor 30, but also securely supports the motor 30. In addition, the first connection unit 81 not only electrically connects to the photosensitive chip 20, but also affixes the photosensitive chip 20 at a predetermined position.

The first connection unit 81 comprises a photosensitive chip connection element 81a and a motor connection element 81b, wherein the photosensitive chip 20 and the electrical bracket 10 are connected with each other by the photosensitive chip connection element 81, and the motor 30 and the electrical bracket 10 are connected with each other by the motor connection element 81b.

Generally speaking, the photosensitive chip 20 is electrically connected with the electrical bracket 10. The photosensitive chip 20 comprises a plurality of photosensitive chip guides 21 and a photosensitive chip main body 22, wherein the photosensitive chip guides 21 are formed on the photosensitive chip main body 22. The photosensitive chip guides 21 are electrically connected to the photosensitive connection elements 81a, so that the photosensitive chip 20 is electrically connected to the electrical bracket 10. Accordingly, each of the photosensitive connection elements 81a comprises a photosensitive chip connecting disc 811a and a photosensitive chip conduction element 812a, wherein the photosensitive chip conduction element 812a is arranged on the photosensitive chip connecting disc 811a in order to adjustably increase a height of the photosensitive chip connection element 81a, and then the photosensitive chip connecting disc 811a can be electrically connected with the photosensitive chip 20.

It is worth mentioning that the photosensitive chip connecting disc 811a is embodied as a traditional connection pad, so that a traditional connection pad can be applied to the present invention.

Accordingly, the photosensitive chip conduction element 812a is embodied as a metal body, wherein the metal body can be gold, copper, tin-nickel alloys or other alloys.

Generally speaking, after the photosensitive chip conduction element 812a is coupled to the photosensitive chip connecting disc 811a of the electrical bracket 10, the electrical bracket 10 and the photosensitive chip 20 are connected with each other in a default mode, wherein the photosensitive chip conduction element 812a is a metal body, made of gold, copper, or tin-nickel alloys, wherein a height of the photosensitive conduction element 812a can be preset.

It is worth mentioning that the photosensitive chip connecting disc 811a can be used as the normal connection pad in order to reduce the improvement cost. Of course, the photosensitive chip connecting disc 811a can be other kinds of connecting disc.

The motor 30 comprises a plurality of motor guides 31 and a motor main body 32, wherein the motor guides 31 are provided on the motor main body 32, wherein the motor guides 31 are electrically connected to the motor connection element 81b, so that the motor 30 is electrically connected to the electrical bracket 10. It is worth mentioning that positions of the motor guides 31 are located corresponding to positions of the motor connection elements 81b of the electrical bracket 10. Therefore, while the motor 30 is coupled on the electrical bracket 10, the motor 30 can be electrically connected with the circuit module 12, and further be electrically connected with the flexible circuit board 50. More specifically, the motor guides 31 and the motor connection element 81b of the electrical bracket 10 are electrically connected with each other.

Accordingly, each of the motor connection elements 81b comprises a motor connecting disc 811b and a motor conduction element 812b, wherein the motor conduction element 812b is formed on the motor connecting disc 811b, and then the motor connecting disc 811b can be electrically connected with the motor 30.

It is worth mentioning that the motor connecting disc 811b is embodied as a traditional connection pad, so that a traditional connection pad can be applied to the present invention.

Accordingly, the motor conduction element 812b is embodied as a metal body, wherein the metal body can be made of gold, copper, tin-nickel alloys or other alloys.

Generally speaking, after the motor conduction element 812b is coupled to the motor connecting disc 811b of the electrical bracket 10, the electrical bracket 10 and the motor 30 is connected with each other in a default mode, wherein the motor conduction element 812b is a metal body, made of gold, copper, or tin-nickel alloys, wherein a height of the motor conduction element 812a can be preset.

It is worth mentioning that the motor connecting disc 811b can be used as the traditional connection pad in order to reduce the improvement cost. Of course, the motor connecting disc 811b can be other kinds of connecting disc.

Accordingly, the first conduction element 812 is embodied as a metal body, made of gold, copper, tin-nickel alloys or other alloys, but not limited to the above mentioned metal.

Accordingly, the electrical bracket 10 is electrically connected with the electrical components 40 by, but not limited to an ACP (Anisotropic conductive adhesive), an ultrasonic soldering, a heat-pressure soldering, and a reflow soldering process.

More specifically, the first conduction element 812 coupled on the first connection element 811 of the electrical bracket 10 is embodied as a metal body, made of, but not limited to, gold, copper, tin-nickel alloys, or other alloys. And, the electrical bracket 10 and the motor 30 are electrically connected with each other by a default mode.

It is worth mentioning that the traditional connection pad can be used to the above mentioned connection method in order to reduce the improvement cost. Of course, the first connection element 811 can be other kinds of connecting disc.

The second connection unit 82 comprises a plurality of circuit board connection elements 82a and a plurality of electronic component connection elements 82b. As shown in FIG. 4, the electrical bracket 10 is electrically connected with the flexible circuit board 50 through the circuit board connection elements 82a. More specifically, the flexible circuit board 50 comprises a plurality of circuit board guides 51 and a circuit board main body 52, wherein the circuit board guides 51 are formed on the circuit board main body 52. The circuit board guides 51 are electrically connected to the circuit board connection element 82a, so that the flexible circuit board 50 is electrically connected to the electrical bracket 10.

Accordingly, the electrical bracket 10 is coupled to the flexible circuit board 50, wherein the electric bracket 10 is securely supported by the flexible circuit board 50, and the flexible circuit board 50 is electrically connected with the electric bracket 10. It is worth mentioning that the positions of the circuit board guides 51 on the circuit board main body 52 are corresponding to positions of the circuit board connection elements 82a of the electrical bracket 10. While the flexible circuit board 50 is coupled to the electrical bracket 10, the circuit board connection elements 82a are electrically connected to the electrical bracket 10, wherein the electronic connection method is, but not limited to, a soldering method.

According to the above mentioned preferred embodiment of the present invention, the circuit board connection elements 82a are embodied as circuit board pads. The electrical bracket 10 and the flexible circuit board 50 are soldered with each other. It is worth mentioning that the connection method between the electrical bracket 10 and the flexible circuit board 50 is, but not limited to, the soldering method.

The electronic component connection elements 82b are formed on the main body 11. The electronic component connection elements 82b are embodied as electronic component pads, which are adapted to connect with the electrical components 40. The electrical components 40 are electrically connected with the electrical bracket 10 by a soldering method.

It is worth mentioning that the flexible circuit board 50, the circuit board connection elements 82a connected to the electrical components 40, and the electronic component connection elements 82b are embodied as the first connection unit 81a and the motor connection element 81b having a metal conduction component.

It is worth mentioning that the flexible circuit board 50 and the electrical bracket 10 can be embodied as one piece structure. In addition, the flexible circuit board 50 and the electrical bracket 10 also can be designed to different shapes.

Figure 5:
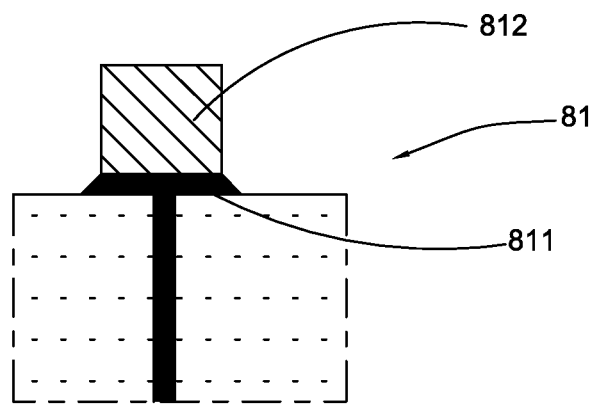
FIG. 5 is a perspective view of a first connection unit of the camera module according to the above first preferred embodiment of the present invention.

As shown in FIG. 4 and FIG. 5, the metal body (which is embodied as the motor conduction element 812b and the photosensitive conduction element 812a) of the connection arrangement 80 (which is embodied as a pad in the present invention) are arrayed by a plating or sputtering method.

It is worth mentioning that the first connection unit 81 is formed on the electrical bracket 10, and is connected to other components of the camera module by, but not limited to, a soldering method. The first connection unit 81 also can be arranged on other components of the camera module, such as the photosensitive chip 20 and the motor 30, and then is electrically soldered with the electrical bracket 10.

Figure 6A:
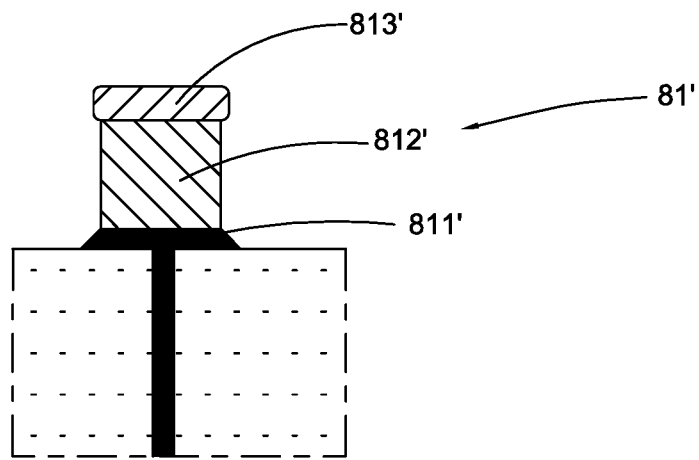
FIG. 6A illustrates a first alternative mode of the first connection unit of the camera module according to the above first preferred embodiment of the present invention.

FIG. 6A illustrates a first alternative mode of the first connection unit 81 of the camera module according to the above preferred embodiment of the present invention, wherein the first connection unit 81' comprises a first connection element 811', a first conduction element 812', and a first coating layer 813', wherein the first conduction element 812' is securely affixed on the first connection element 811' in order to adjustably increase a height of the first connection element 811', and then the first connection element 811' is electrically connected to the first conduction element 812'. The first coating layer 813' is securely affixed on the first conduction element 812' in order to adjustably increase the height of the first connection unit 81', so as to facilitate the electrical connection between the first connection unit 81' and other parts of the camera module, and further facilitate the manufacturing process of the camera module. Accordingly, the first conduction element 812' is embodied as a metal cylinder, and the first connection element 811' is embodied as a pad, wherein the metal body is affixed on a top portion of the pad by, but not limited to, a plating method. The first conduction element 812' can be selectively made of, but not limited to, gold, copper, or tin-nickel alloys. Accordingly, the first coating layer 813' is a metal coating layer, which is preferably a tin coating layer. The first coating layer 813' is affixed on the first conduction element 812' by a printing or coating technology.

It is worth mentioning that the first connection element 811' and the first conduction element 812' not only can be plated with each other to form one piece structure, but also can be separately manufactured. For example, the metal cylinder is plated on the current pad. It is worth mentioning that the first connection unit 81' can be arranged on the electrical bracket 10, the photosensitive chip 20, the motor 30, the electrical components 40, or the flexible circuit board 50. Preferably, the first connection unit 81' is plated on the circuit board or the electrical bracket. Accordingly, the first connection element 811' of the first connection unit 81' is embodied as the pads of electrical bracket 10 or of the electrical components of the traditional circuit board, so that the traditional technology can be used in the present invention in order to decrease the manufacturing cost and simplify the manufacturing process.

It is worth mentioning that the first connection unit 81' is embodied as that a cylinder body being attached on pads of the electrical components, such as chips, circuit board, or electrical bracket, wherein the cylinder body can be attached on the pads thereof by different kinds of coating method. The first conduction element 812' is embodied as the cylinder body, wherein a height of the first conduction element 812' can be preset.

The first coating layer 813' is provided to adjustably increase the height of the first connection unit 81' also, so as to facilitate the connection between the first connection unit 81' and other electrical components of the camera module.

Accordingly, the first conduction element 812' of the first connection unit 81' is, but not limited to, embodied as the cylinder body. The first conduction element 812' also can be, but not limited to, embodied as other metal bodies or conductive bodies. Accordingly, the first connection unit 81' is, but not limited to, embodied as the first conduction element 812' (cylinder body) being plated on the first connection element 811'. Accordingly, the first conduction element 812' can be affixed on the first connection element 811' by a bumping technology.

Figure 6B:
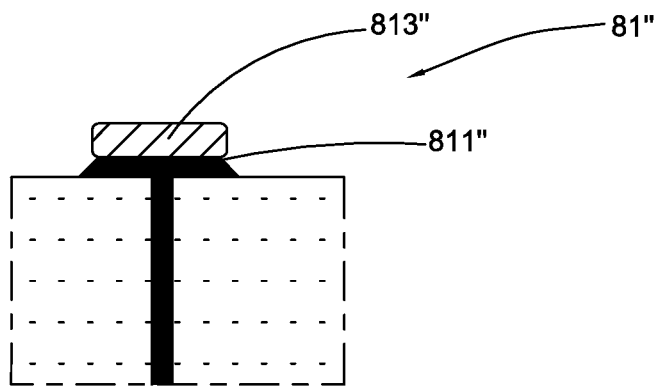
FIG. 6B illustrates a second alternative mode of the first connection unit of the camera module according to the above first preferred embodiment of the present invention.

FIG. 6B illustrates a second alternative mode of the first connection unit 81 of the camera mode according to the above preferred embodiment of the present invention, wherein the first connection unit 81" comprises a first connection element 811" and a first coating layer 813", wherein the first coating layer 813" is securely affixed on the first connection element 811" in order to adjustable increase the height of the first connection unit 81", so as to facilitate the electrical connection between the first connection unit 81" and other parts of the camera module, and further facilitate the manufacturing process of the camera module. Accordingly, the first connection element 811" is embodied as a pad, and the first coating layer 813" is embodied as a metal coating layer, which is preferably a tin coating layer. The first coating layer 813' is affixed on the first connection element 811" by a printing or coating technology.

It is worth mentioning that the first connection unit 81" can be formed on the electrical bracket 10, the photosensitive chip 20, the motor 30, the electrical components 40, or the flexible circuit board 50. Preferably, the first connection unit 81" is embodied as that the first coating layer 813" being attached on the circuit board or the electrical bracket. It is worth mentioning that the first connection element 811" of the first connection unit 81" is embodied as the pads of the electrical bracket 10 or the electrical components of the traditional circuit board, so that the traditional technology can be used in the present invention in order to decrease the manufacturing cost and simplify the manufacturing process.

Figure 6C:
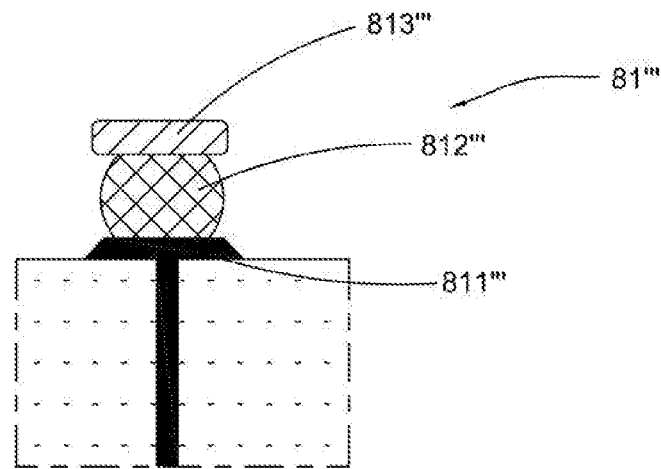
FIG. 6C illustrates third alternative mode of the first connection unit of the camera module according to the first preferred embodiment of the present invention.

FIG. 6C illustrates a third alternative mode of the first connection unit 81 of the camera mode according to the above preferred embodiment of the present invention, wherein the first connection unit 81''' comprises a first connection element 811''', a first conduction element 812''', and a first coating layer 813''', wherein the first conduction element 812' is securely affixed on the first connection element 811' in order to adjustably increase a height of the first connection unit 81''', and then the first connection element 811''' is electrically connected to the first conduction element 812'''. The first coating layer 813' is securely affixed on the first conduction element 812''' in order to adjustably increase the height of the first connection unit 81', so as to facilitate the electrical connection between the first connection unit 81' and other parts of the camera module, and further facilitate the manufacturing process of the camera module. Accordingly, the first conduction element 812''' is embodied as a metal sphere, and the first connection element 811''' is embodied as a pad, wherein the metal spherical bump is affixed on a top portion of the pad by, but not limited to, a bumping method. The first conduction element 812''' can be selectively made of, but not limited to, gold, copper, or tin-nickel alloys. Accordingly, the first coating layer 813' is a metal coating layer, which is preferably a tin coating layer. The first coating layer 813' is affixed on the first conduction element 812''' by a printing or coating technology.

It is worth mentioning that the first connection element 811''' can be arranged on the electrical bracket 10, the photosensitive chip 20, the motor 30, the electrical components 40, or the flexible circuit board 50. Preferably, the first connection unit 81''' is plated on the circuit board or the electrical bracket. Accordingly, the first connection element 811''' of the first connection unit 81''' is embodied as the pads of electrical bracket 10 or of the electrical components of the traditional circuit board, so that the traditional technology can be used in the present invention in order to decrease the manufacturing cost and simplify the manufacturing process.

It is worth mentioning that the first connection unit 81''' is embodied that a metal spherical bump being attached on pads of the electrical components, such as chips, a circuit board, or an electrical bracket, wherein the coating layer is attached on the metal sphere. The coating layer 813''' not only adjustably increases a height of the first connection unit 81''', but also solves the problems of the traditional flip chip technology, which cannot achieve the requirement of the height of the first connection unit 81''' while only one metal spherical bump is used in the flip chip technology, so that in the traditional flip chip technology, the metal spherical bump is applied during the flip chip technology twice, and then the steps of the traditional flip chip technology is relatively more complicated.

Accordingly, the first coating layer 813''', embodied as the tin coating layer, can support the electrical connection between the first connection unit 81''' and other electrical components of the camera module. In addition the first connection element 811''' and the first conduction element 812''' can be supported by the first coating layer 813''' in a predetermined position.

While different electrical components are electrically connected with each other by a reflow soldering method, a tin layer is required to attach on the electrical components. The tin layer can provide a secure connection property. In addition, the tin layer not only adjustably increases a height of the first connection unit 81, 81", 81''', but also provides a better performance for the first connection unit 81, 81", 81'''.

Figure 6D:
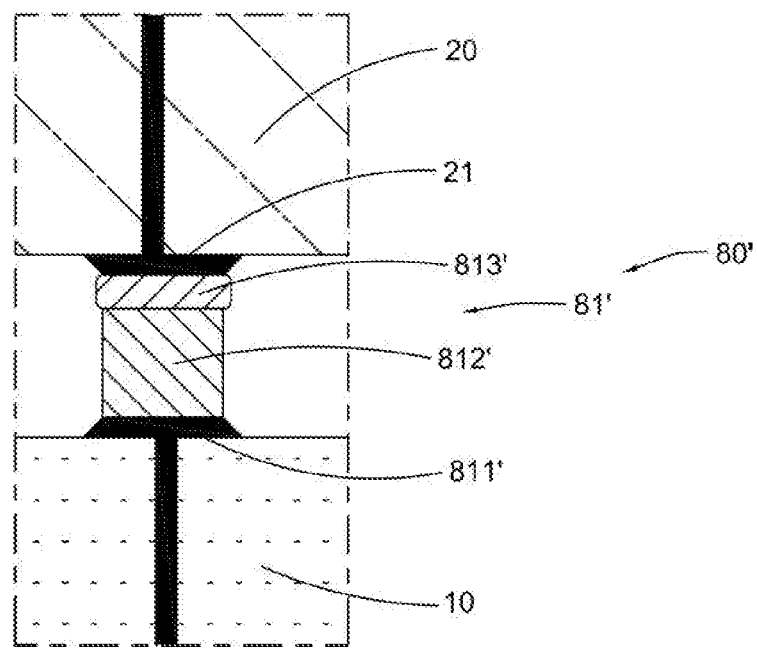
FIG. 6D illustrates a fourth alternative mode of the first connection unit of the camera module according to the above first preferred embodiment of the present invention.

As shown in FIG. 6D, an application method of the above mentioned the first alternative mode of the first connection unit 81 according to the preferred embodiment of the present invention is illustrated.

The first conduction element 812' of the first connection unit 81' is a metal pillar. The first connection element 811' is a pad. The first coating layer 813' is a tin coating layer. In this application, the first connection unit 81' can be electrically connected with the electrical bracket 10 and the photosensitive chip 20, wherein the first connection element 811' is embodied as a photosensitive chip pad arranged on the electrical bracket 10, wherein the first conduction element 812' is arranged on the photosensitive chip pad. After the tin coating layer is attached on the first conduction element 812', the first conduction element 812' is securely connected with the photosensitive chip guide 21 of the photosensitive chip 20. The first connection element 811' of the first connection unit 81' is, but not limited to be, arranged on the electrical bracket 10, and then the first connection element 811' is soldered with the photosensitive chip 20 by the first coating layer 813', embodied as the tin coating layer. In addition, the first connection element 811' of the first connection unit 81' can be arranged on the photosensitive chip 20, and then the first connection element 811' is soldered with the electrical bracket 10 by the first coating layer 813', embodied as the tin coating layer.

Furthermore, it is worth mentioning that the first connection unit 81' is, but not limited to, connected with the electrical bracket 10, the photosensitive chip 20, and other components of the camera module.

As shown in FIG. 6D, the application method of the first connection unit 81' is illustrated, wherein the application method also can be applied to the first connection unit 81', 81'''.

According to the first preferred embodiment of the present invention, it is worth mentioning that the first connection unit 81 is, but not limited to, adapted to electrically connect the photosensitive chip 20 or the motor 30 with the electrical bracket 10 respectively. In addition, the first connection unit

Figure 1:
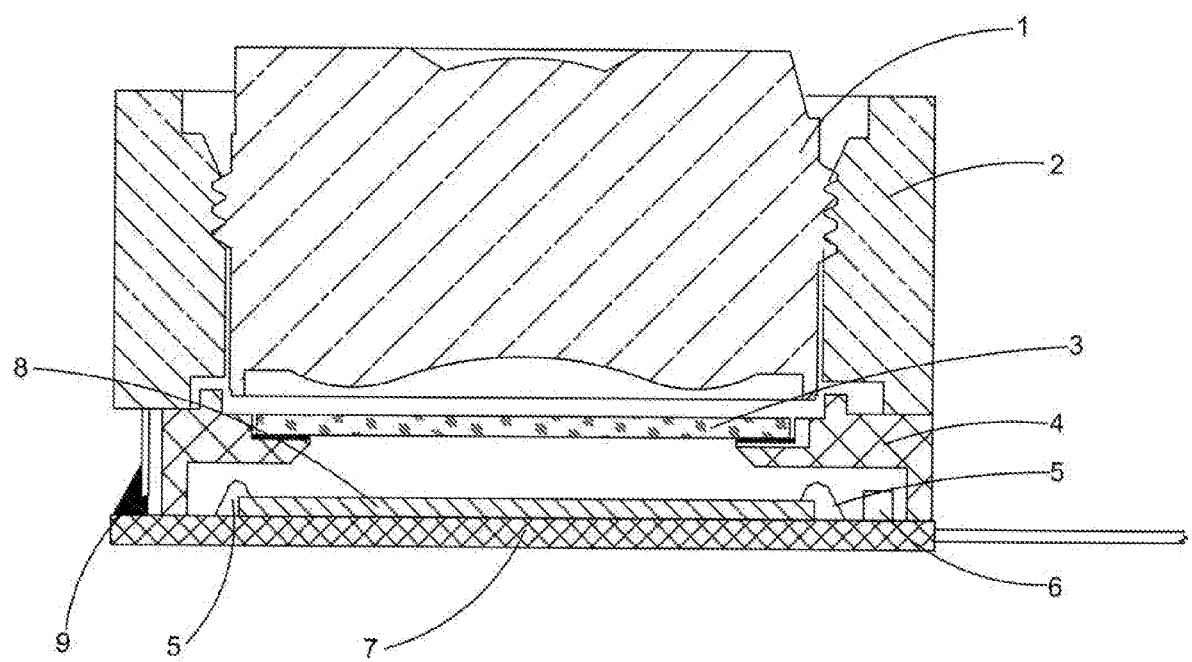
FIG. 1 illustrates a conventional camera module.

81 also can be applied to other components of the camera module. For example, the flexible circuit board 50 can be electrically connected to the electrical bracket 10. Furthermore, not only the other electrical components and the electrical bracket of the camera module, but also each of the other components of the camera module can bb electrically connected with each other by the first connection unit 81. For example, as shown in FIG. 1, the circuit board and the photosensitive chip of the current technology can be electrically connected with each other.

Figure 7:
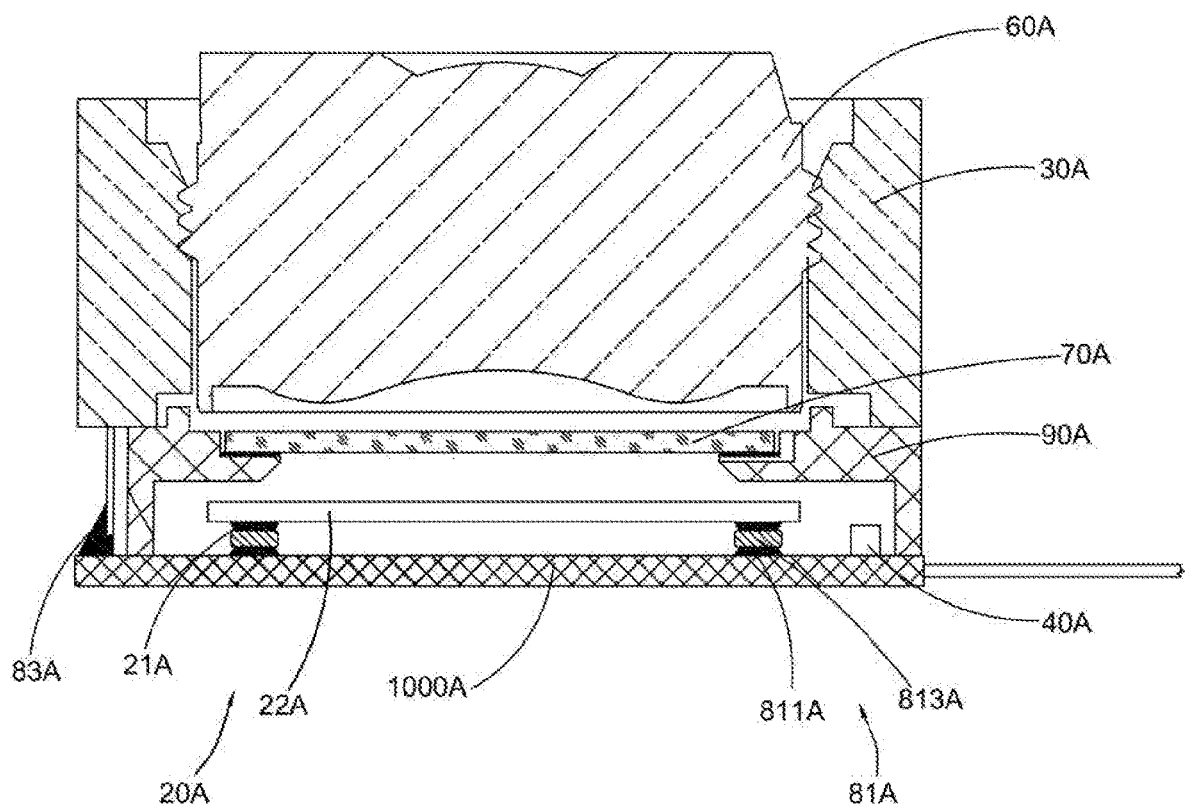
FIG. 7 is a sectional view of a camera module according to a second preferred embodiment of the present invention.
Figure 8:
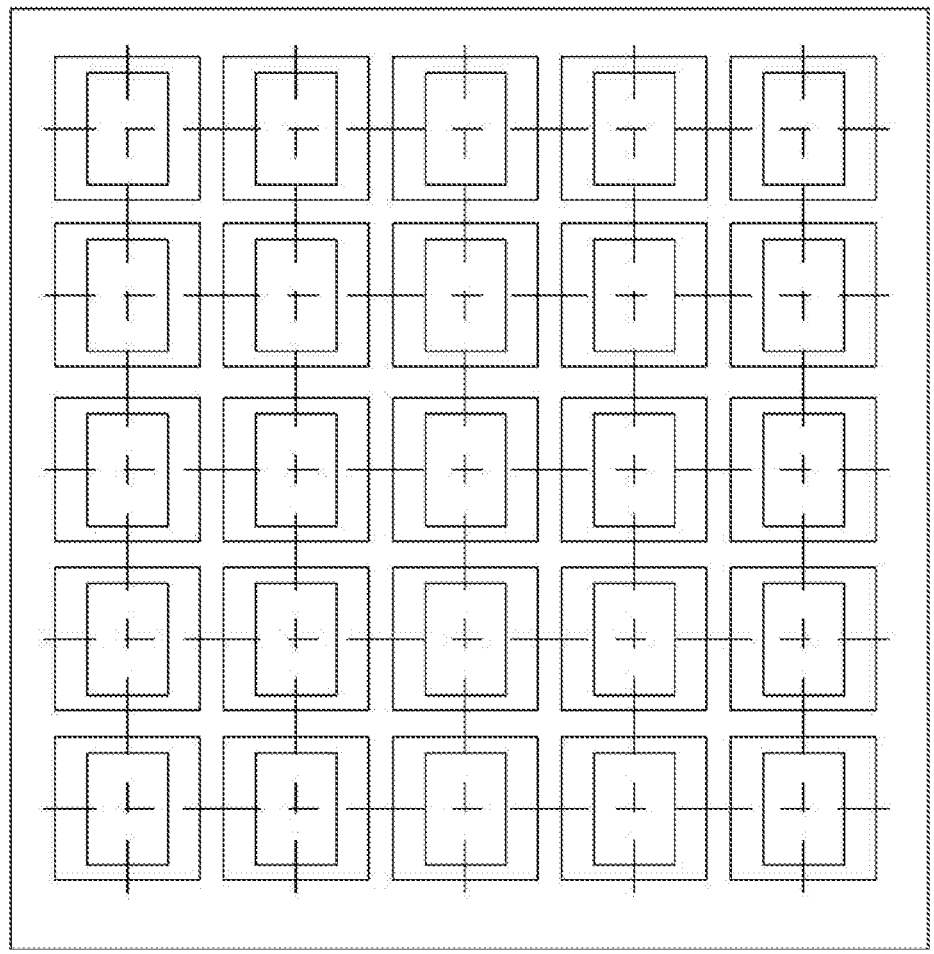
FIG. 8 shows an arraying process of a manufacturing process of a first connection unit of the camera module according to the above mentioned the first preferred embodiment of the present invention.
Figure 9C:
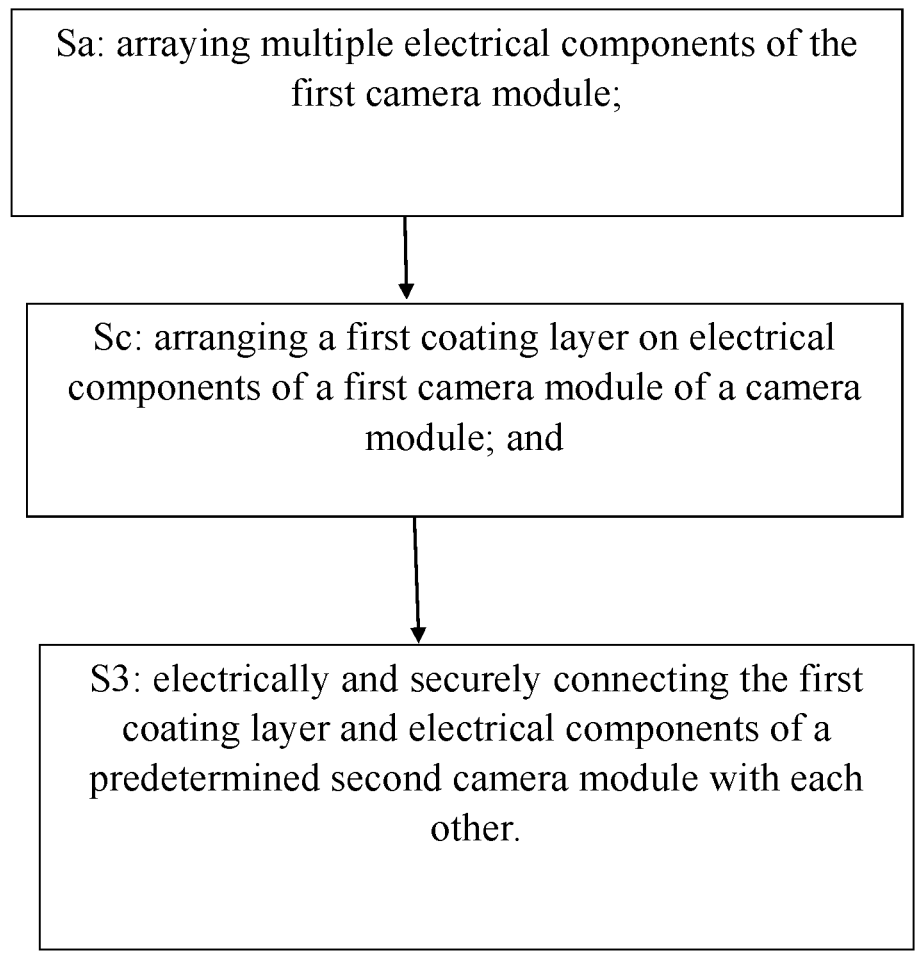

Referring to FIG. 7 of the drawings, a camera module according to a second preferred embodiment of the present invention is illustrated, wherein the camera module comprises a base 90A, a photosensitive chip 20A, a motor 30A, a plurality of electronic elements 40A, a rigid circuit board 1000A, and an optical lens 60A, wherein the motor 30A of the camera module is supported by the base 90A.

Specifically, the optical lens 60A is operatively coupled at the motor 30A, wherein the optical lens 60A can be actuated by the motor 30A to from an auto-focusing mechanism. The rigid circuit board 1000A and the motor 30A are arranged on different sides of the base 90A, and the optical lens 60A is located along a photosensitive path of the photosensitive chip 20A. When the camera module is operated for capturing image, the light reflected by the object can be further accepted by the photosensitive chip 20A for photoelectric conversion after passing through the optical lens 60A. That is to say, the rigid circuit board 1000A and the motor 30A are connected by the base 90A. In other words, the base 90A serves as an integration of a base and a PCB in a conventional camera module, wherein the base 90A forms an assembling means for connecting the motor 30A and the optical lens 60A and forms an electrical connection means for electrically connecting to the motor 30A, the photosensitive chip 20A and the rigid circuit board 1000A with each other The base 90A comprises a base main body 91A and an optical hole 100A.

As shown in FIG. 7, the camera module further comprises a plurality of connection elements 80A, which are arranged to connect with the rigid circuit board 1000A, the photosensitive chip 20A, the motor 30A, and the electrical components 40A, so that the photosensitive chip 20A, the motor 30A, and the electrical components 40A can be electrically connected via the connection elements 80A.

According to the above mentioned preferred embodiment, the camera module further comprises an optical filter 70A, wherein the optical filter 70A is adapted to filter out stray lights in order to improve the image quality. The optical filter 70A is coupled to the base 90A.

The photosensitive chip 20A is aligned at a position corresponding to the optical hole 100A, so lights pass through the optical hole 100A and are received by the photosensitive chip 20A.

As shown in FIG. 7, the connection elements 80A comprises a plurality of first connection units 81A, a plurality of second connection units 82A, and a plurality of third connection elements 83A, wherein the first connection units 81A are connected to the photosensitive chip 20A and the rigid circuit board 1000A respectively, wherein the second connection units 82A are connected to the electrical components 40A and the rigid circuit board 1000A respectively, wherein the third connection elements 83A are electrically connected to the motor 30A and the rigid circuit board 1000A. It is worth mentioning that the first connection units 81A can also be electrically connected to the electrical components 40A and the motor 30A with the rigid circuit board 1000A respectively.

As shown in FIG. 7, each of the first connection units 81A comprises a first connection element 811A and a first coating layer 813A, wherein the first coating layer 813A is securely affixed on the first connection element 811A in order to adjustably increase the height of the first connection unit 81A, so as to secure the electrical connection between the first connection unit 81A and the photosensitive chip 20A.

It is worth mentioning that the first connection unit 81A not only electrically connects with the photosensitive chip 20A, but also securely affixes the photosensitive chip 20A in a predetermined position.

Generally speaking, the photosensitive chip 20A is electrically connected to the rigid circuit board 1000A. The photosensitive chip 20A comprises a plurality of photosensitive chip guides 21A and a photosensitive chip main body 22A, wherein the photosensitive chip guides 21A are arranged on the photosensitive chip main body 22A. The photosensitive chip guides 21A are electrically connected to the photosensitive connection units 81A, so that the photosensitive chip 20 is electrically connected to the rigid circuit board 1000A. Accordingly, each of the first connection units 81A comprises a first connection unit 811A and a first coating layer 813A, wherein the first coating layer 813A is securely affixed on the first connection element 811A in order to adjustably increase the height of the first connection unit 81A, so as to facilitate the electrical connection between the first connection unit 81A and other parts of the camera module, and further facilitate the electrical and securely connection between the photosensitive chip 20A and the rigid circuit board 1000A. The first connection element 811A is embodied as a pad, and the first coating layer 813A is embodied as a metal coating layer, which is preferably a tin coating layer. The first coating layer 813A is affixed on the first connection element 811A by a printing or coating technology.

It is worth mentioning that the first connection element 811A is embodied as a traditional connection pad, so that a traditional connection pad can be applied to the present invention. Therefore, the cost of the improvement of the traditional technology can be minimized to prevent the source-wasting of the present invention.

The motor 30A comprises a plurality of motor guides 31A and a motor main body 32A, wherein the motor guides 31A are formed on the motor main body 32A. The motor guides 31A are electrically connected to the rigid circuit board 1000A through a third connection element 83A, so as to achieve the electrical connection between the motor 30A and the rigid circuit board 1000A.

Accordingly, the electrical components 40A are electrically connected with the rigid circuit board 1000A through a second connection unit 82A, so as to achieve the electrical connection between the electrical components 40A and the rigid circuit board 1000A.

According to the above mentioned preferred embodiment of the present invention, the electrical connection method between the motor 30A and the rigid circuit board 1000A can be embodied as, but not limited to, the first connection unit 81A.

It is worth mentioning that the rigid circuit board 1000A and the base 90A are two individual components. And, the rigid circuit board 1000A and the base 90A can be embodied as one piece integrated structure. Furthermore, the rigid circuit board 1000A and the base 90 can also be designed as different shapes.

As shown in FIG. 7, a manufacturing process of the first connection unit 81A of the rigid circuit board 1000A is applied by an arraying process.

It is worth mentioning that the rigid circuit board 1000A and the photosensitive chip 20A according to the second preferred embodiment of the present invention are electrically connected with each other by the first connection unit 81, 81', 81'''.

Referring to FIGS. 8 and 9A-9C of the drawings, a circuit conducting method for a camera module according to a third preferred embodiment of the present invention is illustrated, wherein the circuit conducting method comprises steps of:

S1: forming a first conduction element on a first camera component module of the camera module, wherein the first camera component module comprises, but not limited to, a motor, an electrical bracket, a photosensitive chip, a circuit board, and an electronic component, wherein the first conduction element can be embodied as a metal body.

S2: electrically and securely connecting the first conduction element and a second camera component module with each other, wherein the first conduction element and the second camera component module are, but not limited to be, soldered with each other.

Accordingly, a manufacturing method of the electrical bracket 10 is applied by an arraying process. Before the step S1, the circuit conducting method further comprises steps of:

Sa: arraying multiple electrical components of the first camera component module.

Accordingly, a coating layer can be affixed on the metal body, and alternatively, wherein the step S2 can be omitted in the circuit conducting method, and the circuit conducting method comprises the steps of:

Sb: forming a first coating layer on the first conduction element, wherein the first coating layer is a metal coating layer, wherein the metal coating layer is, but not limited to, a tin coating layer; and S3: electrically and securely connecting the first coating layer and second camera component module with each other, wherein the first conduction element and the second camera component module are, but not limited to be, soldered with each other.

In the step S1, the metal body can be embodied as metal pillars or metal sphere.

The metal body is arranged on the first camera component module through, but not limited to, a plating or metal implanting method.

It is worth mentioning that, the electrical components of the camera module in the step S1 and the electrical components of the camera module in the step S2 can be embodied as a motor, an electrical bracket, a photosensitive chip, a circuit board and electronic components of the camera module.

Accordingly, the step S1 can be embodied as that: the metal body is arranged on a pad of the first camera component module, wherein the first camera component module comprises, but not limited to, a motor, a photosensitive chip, a circuit board, and electronic elements.

It is worth mentioning that the metal coating layer can be directly printed on the first connection element, for example a pad. Therefore, no first conduction element, such as metal body, is required to the circuit conducting method, wherein this circuit conducting method comprises the following steps of:

Sc: forming a first coating layer on the first camera component module, wherein the first camera component module comprises, but not limited to, a motor, an electrical bracket, a photosensitive chip, a circuit board, and electronic components, wherein the first coating layer can be embodied as a metal coating layer, wherein the metal coating layer can be, but not limited to, a tin-coating layer.

It is worth mentioning that the electrical components of the first and second camera component modules are laminated by a wave-soldering technology to achieve the electrical conduction.

Accordingly, the step Sc can be embodied as that: the metal coating layer is attached on a pad of the first camera component module, wherein the first camera component module comprises, but not limited to, a motor, an electrical bracket, a photosensitive chip, a circuit board, and electronic components.

Figure 10A:
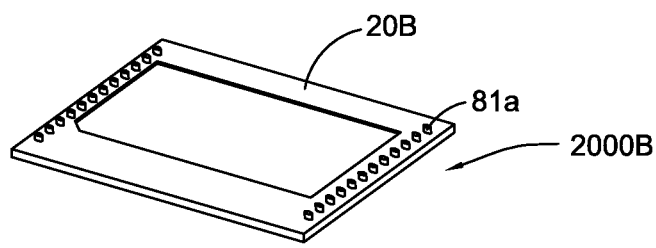
FIGS. 10A and 10B illustrate a photosensitive chip assembly according to a third preferred embodiment of the present invention.
Figure 10B:
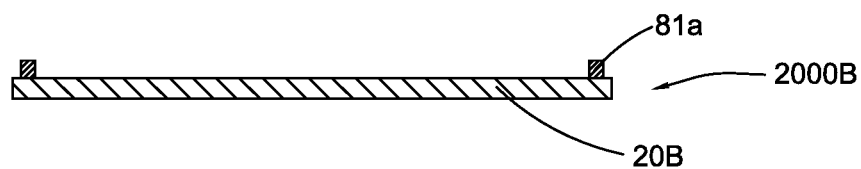

Referring to FIG. 10A and FIG. 10B of the drawings, a photosensitive chip assembly 2000B according to a third preferred embodiment of the present invention is illustrated, wherein the photosensitive chip assembly 2000B comprises a photosensitive chip 20B and a plurality of photosensitive chip connection elements 81a. The photosensitive chip connection elements 81a are embodied as a plurality of elongated metal bodies alignedly formed on the photosensitive chip assembly 2000B, and are electrically connected with the photosensitive chip 20B. While the photosensitive chip assembly 2000B is applied to the camera module, the photosensitive chip 20B and predetermined components of the camera module is electrically connected with each other by the photosensitive chip connection element 81a.

The photosensitive chip connection elements 81a have a predetermined thickness, to facilitate the electrical connection between the photosensitive chip 20B and predetermined components of the camera module, and facilitate the assembly of the camera module. It is worth mentioning that each of the photosensitive chip connection elements 81a can be formed in elongated metal cylinder, and the thickness/length of the metal cylinder can be adjustably pre-designed.

The photosensitive chip connection element 81a is embodied as a metal body, wherein the photosensitive chip connection element 81a is made of, but not limited to, gold, copper, alloys, or tin-nickel alloys. In addition, the photosensitive chip connection element 81a can be made of multiple metals.

Accordingly, a semiconductor metal plating technique is applied to the photosensitive chip connection element 81a, wherein the photosensitive chip connection elements 81a, a metal body, are elongated copper. In other words, the photosensitive chip connection elements 81a are formed as micro copper pillars arranged on the photosensitive chip 20.

It is worth mentioning that according to the third preferred embodiment of the present invention, the photosensitive chip connection element 81a is electrically connected with an internal circuit of the photosensitive chip 20B, so that the photosensitive chip 20B can perform predetermined functions for the camera module.

Figure 11A:
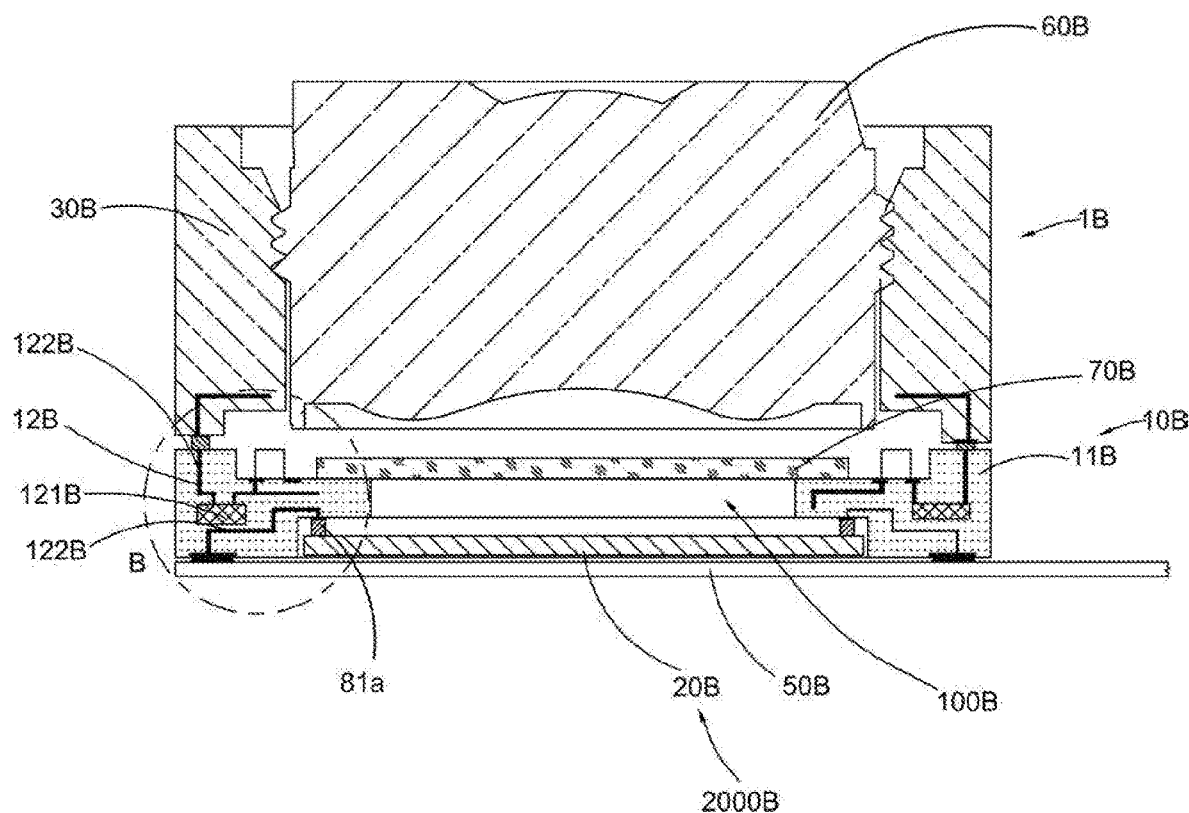
FIGS. 11A and 11B illustrate an application of a photosensitive chip assembly of a camera module according to the above third preferred embodiment of the present invention.

FIG. 11A illustrates an application of the photosensitive chip assembly 2000B of the camera module 1B according to the above mentioned third preferred embodiment of the present invention. As shown in FIG. 11A, the camera module 1B comprises an electrical bracket 10B, a photosensitive chip 20B, a motor 30B, a flexible circuit board 50B, and an optical lens 60B, wherein the motor 30B of the camera module can be supported by the electrical bracket 10B, and the camera module can be embodied as a focusing camera module.

Specifically, the optical lens 60B is operatively coupled at the motor 30B, wherein the optical lens 60B can be actuated by the motor 30B to from an auto-focusing mechanism. The flexible circuit board 50B and the motor 30B are arranged on different sides of the electrical bracket 10B, and the optical lens 60B is located along a photosensitive path of the photosensitive chip 20B. When the camera module 1B is operated for capturing image, the light reflected by the object can be further accepted by the photosensitive chip 20B for photoelectric conversion after passing through the optical lens 60B. That is to say, the flexible circuit board 50B and the motor 30B are connected with each other by the electrical bracket 10B. In other words, the electrical bracket 10B serves as an integration of a base and a PCB in a conventional camera module, wherein the electrical bracket 10B forms an assembling means for connecting the motor 30B and the optical lens 60B and forms an electrical connection means for electrically connecting to the motor 30B, the photosensitive chip 20B and the flexible circuit board 50B with each other.

The electrical bracket 10B comprises a main body 11B and a circuit module 12B. The circuit module 12B is embedded in the main body 11B. As shown in FIG. 11A, the camera module 1B further comprises a plurality of connection element 80B, which is adapted to connect the circuit module 12B, the photosensitive chip 20B, the motor 30B, and the flexible circuit board 50B of the camera module 1B.

The circuit module 12B comprises a plurality of electrical elements 121B and a plurality of conductors 122B, wherein the plurality of the conductor 122B are electrically connected to the electrical elements 121B in a default mode. In addition, the conductors 122B are electrically connected to the motor 30B, the flexible circuit board 50B, and the photosensitive chip 20B through the connection elements 80B so as to pre-form a camera circuit of the camera module.

Figure 11B:
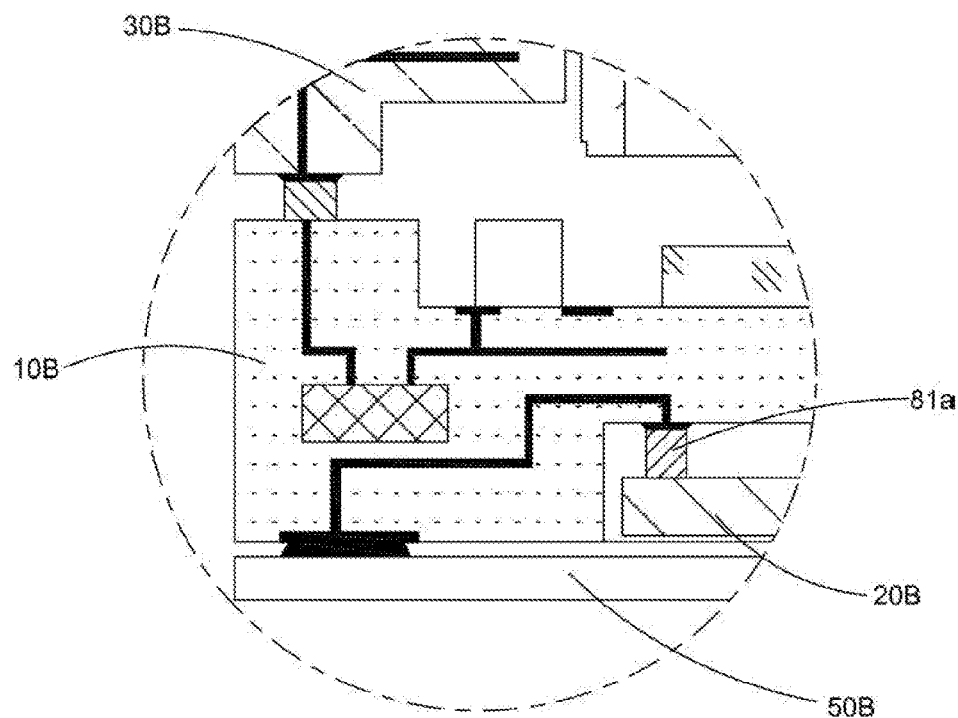

Referring to FIG. 11B of the drawings, the connection elements 80B are electrically connected to the circuit module 12B at the electrical bracket 10B.

According to the above mentioned preferred embodiment, the camera module 1B further comprises an optical filter 70B, wherein the optical filter 70B is adapted to filter out stray lights in order to improve the image quality. The optical filter 70B is arranged on the main body 11B of the electrical bracket 10B. It is worth mentioning that the optical filter 70B is, but not limited to, arranged on the main body 11B of the electrical bracket 10B.

The photosensitive chip 20B is aligned at a position corresponding to the optical hole 100B, so lights which passes through the optical hole can be received by the photosensitive chip 20.

As shown in FIG. 11A, the electrical bracket 10B comprises an optical hole 100B. The photosensitive chip 20B is arranged on a position corresponding to the optical hole 100B, wherein lights can pass through the optical hole 100B and can be received by the photosensitive chip 20B.

Specifically, according to the above mentioned third preferred embodiment of the present invention, the photosensitive chip 20B is attached on the photosensitive chip connection element 81a (the photosensitive chip 20B is embodied as a copper pillar), wherein the electrical bracket 10B and the photosensitive chip 20B are electrically connected with each other by a predetermined connection method. The photosensitive chip 20B can be, but not limited to, made of copper, gold, or tin-nickel alloys, wherein a height of the photosensitive chip connection element 81a can be adjustably pre-set.

Accordingly, a manufacturing method for the photosensitive chip assembly 2000B is embodied as an arraying method or a panel plating method. That is to say, the photosensitive chip 20B is arranged on the photosensitive chip connection element 81a by the arraying method or the panel plating method. The arraying method and the panel plating method only improves the scale production and the mechanical production of the photosensitive chip assembly 2000B, but also improves the efficiency and accuracy thereof.

A panel plating method for a photosensitive chip assembly 2000B comprises steps of:

a. providing a photosensitive chip panel having a plurality of photosensitive chip 20B arranged thereon;

b. providing a plurality of photosensitive chip connection elements 81a electrically connected to the photosensitive chip panel, which is a photosensitive chip wafer; and c. cutting the photosensitive chip panel into multiple photosensitive assemblies 2000B.

It is worth mentioning that the panel plating method for the photosensitive chip assembly 2000B has high production efficiency. In addition, the panel plating method is easy to operate and accuracy to locate the photosensitive chip assembly 2000B. Furthermore, no arraying step is needed to apply to the panel plating method in order to save the operation space of the panel plating method.

Accordingly, the photosensitive chip connection elements 81a are arranged on the photosensitive chip panel to form a plurality of copper pillars by the semiconductor metal plating technique. That is to say, the photosensitive chip connection elements 81a are implanted on the photosensitive chip panel to reach a predetermined thickness. In addition, the photosensitive chip devices 81a can be attached on the photosensitive chip panel by other copper-implanting method.

The photosensitive chip panel is cut to separate the photosensitive chips, wherein the photosensitive chip connection elements 82a are pre-formed on the photosensitive chip 20B.

Figure 12:
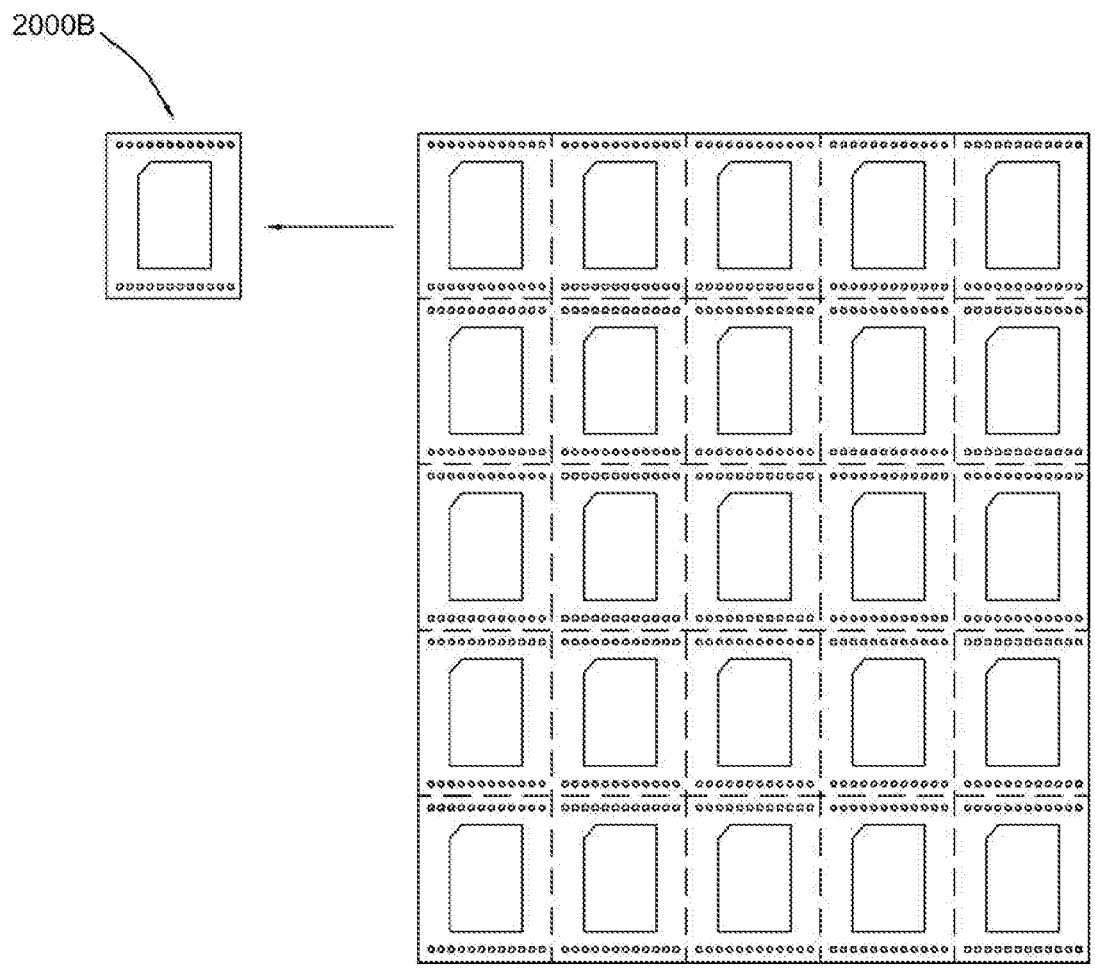
FIG. 12 illustrates a photosensitive chip panel being cut along cutting lines to produce photosensitive chip assemblies according to the above third preferred embodiment of the present invention.

FIG. 12 shows cutting lines of the photosensitive chip panel in the step c, so the photosensitive chip panel is cut along the cutting lines.

It is worth mentioning that the photosensitive chip 20B is electrically connected with the electrical bracket 10B through the photosensitive chip connection element 81a by, but not limited to a ACP (Anisotropic conductive adhesive), ultrasonic soldering, heat-pressure soldering, and reflow soldering process.

Figure 13:
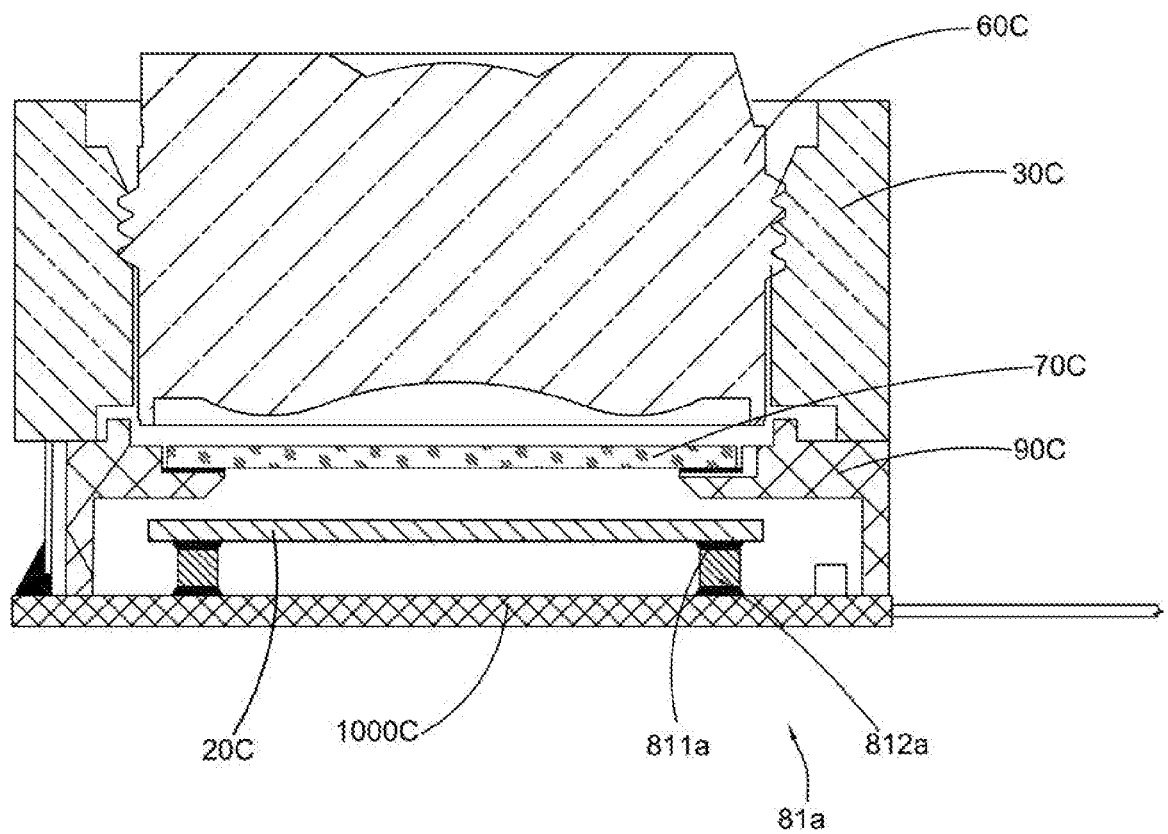
FIG. 13 illustrates a camera module having a photosensitive chip assembly according to a fourth preferred embodiment of the present invention.

Referring to FIG. 13 of the drawings, an application of a photosensitive chip assembly of a camera module according to a fourth preferred embodiment of the present invention is illustrated. The photosensitive chip assembly 2000B comprises a photosensitive chip 20C and a plurality of photosensitive chip connection element 81a. Each of the photosensitive chip connection element 81a comprises a first connection element 811a and a first conduction element 812a, wherein the first conduction element 812a is arranged on the first connection element 811a to adjustably increase a height of the first connection unit 81a, so that the first connection element 811a can be electrically connected to the photosensitive chip 20 and the rigid circuit board 1000A.

The first conduction element 812a of the photosensitive chip connection element 81a is arranged on the first connection element 811a to from an elongated metal body. The first connection elements 811a are embodied as normal metal connection disc (connection pads) arranged on the photosensitive chip 20C. The first conduction element 812a is securely connected with the first connection element 811a, and is electrically connected with the photosensitive chip 20C. While the photosensitive chip assembly is applied to the camera module, the photosensitive chip 20C and predetermined components of the camera module is electrically connected with each other by the photosensitive chip connection element 81*a*.

Each of the photosensitive chip connection elements 81*a* has a predetermined thickness, so as to facilitate the electrical connection between the photosensitive chip 20C and predetermined components of the camera module, and facilitate the assembly of the camera module. It is worth mentioning that the photosensitive chip connection element 81*a* comprises a plurality of elongated metal bodies, and the thickness of the metal bodies can be adjustably pre-designed.

The first conduction element 812*a* of the photosensitive chip connection element 81*a* is embodied as a metal body, wherein the first conduction element 812*a* of the photosensitive chip connection element 81*a* can be made of, but not limited to, gold, copper, alloys, and tin-nickel alloys. In addition, the photosensitive chip connection element 81*a* can be made of multiple metals. The first conduction element 812*a* and the first connection element 811*a* can be the same metals or different metals.

Accordingly, a semiconductor metal plating technique is applied to the photosensitive chip connection element 81*a*, wherein the first conduction element 812*a* of the photosensitive chip connection elements 81*a* is a micro copper pillar.

It is worth mentioning that according to the fourth preferred embodiment of the present invention, the photosensitive chip connection element 81*a* is electrically connected with an internal circuit of the photosensitive chip 20C, so that the photosensitive chip 20C can perform predetermined functions for the camera module.

As shown in FIG. 13, the camera module comprises a base 90C, a photosensitive chip 20C, a motor 30C, a circuit board 1000C, and an optical lens 60C, wherein the motor 30B of the camera module can be supported by the base 90C, and the camera module can be embodied as a focusing camera module.

Specifically, the optical lens 60C is operatively coupled at the motor 30C, wherein the optical lens 60C can be actuated by the motor 30C to from an auto-focusing mechanism. The circuit board 1000C and the motor 30B are arranged on different sides of the base 90C, and the optical lens 60C is located along a photosensitive path of the photosensitive chip 20C. When the camera module is operated for capturing image, the light reflected by the object can be further accepted by the photosensitive chip 20C for photoelectric conversion after passing through the optical lens 60C. That is to say, the circuit board 1000C and the motor 30C are connected with each other by the base 90C. In other words, the base 90C serves as an integration of a base and a PCB in a conventional camera module, wherein the base 90C forms an assembling means for connecting the motor 30C and the optical lens 60C and forms an electrical connection means for electrically connecting to the motor 30C, the photosensitive chip 20C and the circuit board 1000C with each other. The base 90C comprises a base main body 90C and an optical hole 100C.

The camera module comprises an optical filter 70C, wherein the optical filter 70C is adapted to filter out stray lights in order to improve the image quality. The filter 70C is coupled on the base 90C.

The photosensitive chip 20C is aligned at a position corresponding to the optical hole 100C, so lights can pass through the optical hole 100C and can be received by the photosensitive chip 20C.

It is worth mentioning that the circuit board 1000C and the base 90C are two individual components. Or, the circuit board 1000C and the base 90C can be embodied as one piece integrated element. Furthermore, the circuit board 1000C and the base 90C also can be designed as different shapes.

As shown in FIG. 13, a manufacturing process of the first connection unit 81C of the rigid circuit board 1000C is applied by an array process.

It is worth mentioning that an arraying process can be applied to a manufacturing process of the circuit board 1000C.

According to the third preferred embodiment of the present invention, a manufacturing method for the photosensitive chip connection element 81*a* of the photosensitive chip 20C is an arraying method or a panel plating method. That is to say, the photosensitive chip connection element 81*a* of the photosensitive chip 20C is produced by the arraying process or the panel plating method. The arraying method and the panel plating method can not only improve the scale production and the mechanical production of the photosensitive chip assembly 2000C, but also can improve the efficiency and accuracy thereof.

It is worth mentioning that the photosensitive chip 20C is electrically connected with the circuit board 1000C (PCB) through the first conduction element 812*a* and the first connection element 811*a* by, but not limited to an ACP (Anisotropic conductive adhesive), ultrasonic soldering, heat-pressure soldering, and reflow soldering.

A panel plating method for a photosensitive chip 20C having photosensitive connection element 81*a* comprises steps of:

a. providing a photosensitive chip panel, which is a photosensitive chip wafer, having a plurality of photosensitive chips 20C pre-formed thereon;

b. providing a plurality of first conduction elements 812*a* on a plurality of first connection element 811*a* of the photosensitive chip panel; and c. cutting the photosensitive chip panel into multiple photosensitive assembly 2000C having the photosensitive connection elements 81*a*.

It is worth mentioning that the panel plating method for the photosensitive chip assembly 2000C has high production efficiency. In addition, the panel plating method is easy to operate and is accurate to locate the photosensitive chip assembly 2000C. Furthermore, no arraying step is needed to apply to the panel plating method in order to save the operation space of the panel plating method.

Accordingly, the photosensitive chip connection elements 81*a* of the first conduction element 812*a* are arranged on the photosensitive chip panel to form a plurality of copper pillars by the semiconductor metal plating technique. That is to say, the photosensitive chip connection elements 81*a* are plated on the photosensitive chip panel to reach a predetermined thickness.

In addition, it is worth mentioning that the structure and technique of the photosensitive chip connection elements 81*a* of the third embodiment and the fourth embodiment of the present invention can be replaced with each other.

One skilled in the art will understand that the embodiment of the present invention as shown in the drawings and described above is exemplary only and not intended to be limiting.

It will thus be seen that the objects of the present invention have been fully and effectively accomplished. The embodiments have been shown and described for the purposes of illustrating the functional and structural principles of the present invention and is subject to change without departure from such principles. Therefore, this invention includes all modifications encompassed within the spirit and scope of the following claims.

What is claimed is:

1. A camera module, comprising:
an optical lens;
a photosensitive sensor which comprises a plurality of photosensitive sensor guides, wherein said optical lens is located along a photosensitive path of said photosensitive sensor;
a circuit board which comprises a plurality of circuit board guides;
an electrical bracket coupled on said circuit board;
a plurality of first connection units and a plurality of second connection units pre-formed on surfaces of said electrical bracket at predetermined locations; and
a driver, which comprises a plurality of driver guides, arranged for operatively coupling with said optical lens, wherein when said driver is coupled at said electrical bracket, said first connection units are aligned with and electrically connected to said driver guides respectively to electrically connect said electrical bracket with said driver;
wherein said photosensitive sensor guides are aligned with and electrically connected to said first connection units respectively to electrically connect said electrical bracket with said photosensitive sensor when said photosensitive sensor is coupled at said electrical bracket, wherein said circuit board guides are aligned with and electrically connected to said second connection units respectively to electrically connect said electrical bracket with said circuit board when said electrical bracket is coupled on said circuit board, such that said electrical bracket forms an electrical connection means for electrically connecting said photosensitive sensor with said circuit board and an assembling means for connecting said driver with said optical lens.

2. The camera module, as recited in claim 1, wherein said circuit board and said driver are arranged on different sides of said electrical bracket respectively.

3. The camera module, as recited in claim 2, further comprising a photosensitive chip wafer, wherein more than two of said photosensitive sensors are formed at said photosensitive chip wafer, such that said photosensitive chip wafer is cut to separate said photosensitive sensors each having said photosensitive sensor connection elements thereon.

4. The camera module, as recited in claim 1, wherein said first connection units are electrically connected with said circuit board by a method selected from the group consisting of anisotropic conductive adhesive, ultrasonic soldering, heat-pressure soldering, laser welding, and reflow soldering process.

5. The camera module, as recited in claim 1, wherein each of said photosensitive sensor guides forms a photosensitive sensor connection element protruded from said photosensitive sensor for electrically connecting to said electrical bracket.

6. The camera module, as recited in claim 5, further comprising a photosensitive chip wafer, wherein more than two of said photosensitive sensors are formed at said photosensitive chip wafer, such that said photosensitive chip wafer is cut to separate said photosensitive sensors each having said photosensitive sensor connection elements thereon.

7. The camera module, as recited in claim 1, further comprising a photosensitive chip wafer, wherein more than two of said photosensitive sensors are formed at said photosensitive chip wafer, such that said photosensitive chip wafer is cut to separate said photosensitive sensors each having said photosensitive sensor connection elements thereon.

* * * * *